US008610381B2

(12) United States Patent
Utsuno

(10) Patent No.: US 8,610,381 B2
(45) Date of Patent: Dec. 17, 2013

(54) VOLTAGE DETERMINATION DEVICE AND CLOCK CONTROL DEVICE

(75) Inventor: Kikuo Utsuno, Miyazaki (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 156 days.

(21) Appl. No.: 13/347,922

(22) Filed: Jan. 11, 2012

(65) Prior Publication Data

US 2012/0194105 A1 Aug. 2, 2012

(30) Foreign Application Priority Data

Jan. 28, 2011 (JP) ................................ 2011-016810

(51) Int. Cl.
*H03K 19/0948* (2006.01)
*H02K 7/14* (2006.01)
*G05F 5/00* (2006.01)

(52) U.S. Cl.
USPC .......... 318/3; 318/440; 318/400.03; 318/254; 368/80; 368/200; 358/1.14

(58) Field of Classification Search
USPC ......... 318/3, 254, 376, 440, 400.03; 323/311, 323/235; 358/1.14; 368/80, 200; 365/148, 365/154, 183.2
See application file for complete search history.

(56) References Cited

U.S. PATENT DOCUMENTS 6,005,303 A * 12/1999 Hawkes et al. ................. 307/44
6,118,642 A * 9/2000 Benenati et al. ................ 361/89
6,731,181 B2 * 5/2004 Fukayama et al. ............ 331/176
6,775,180 B2 * 8/2004 Biyani et al. .................. 365/154
6,949,900 B1 * 9/2005 Berringer ................. 318/400.03
7,471,069 B2 * 12/2008 Kusafuka et al. ............... 322/11
7,863,845 B2 * 1/2011 Kasai et al. ................... 318/440
7,990,119 B2 * 8/2011 Petty ............................ 323/273
2006/0109057 A1 * 5/2006 Kikuchi ........................ 330/308
2007/0075790 A1 * 4/2007 Liao ........................... 331/36 C
2007/0177412 A1 * 8/2007 Sharp ............................. 363/59
2009/0140673 A1 * 6/2009 Kasai et al. ................... 318/139
2009/0160418 A1 * 6/2009 Kawagishi et al. ........... 323/311
2009/0256534 A1 * 10/2009 Videtich et al. ............... 323/235
2010/0194352 A1 * 8/2010 Kitano et al. ................. 320/162
2011/0157976 A1 * 6/2011 Kuriyama .................. 365/185.2
2011/0254828 A1 * 10/2011 Wadhwa ....................... 345/212
2012/0026532 A1 * 2/2012 Arimoto ...................... 358/1.14
2012/0194149 A1 * 8/2012 Noda ........................... 323/274
2013/0049611 A1 * 2/2013 Wadhwa ....................... 315/175
2013/0134954 A1 * 5/2013 Yano et al. .................... 323/282
2013/0170328 A1 * 7/2013 Manaka et al. ............... 368/200

FOREIGN PATENT DOCUMENTS

JP 2001-044822 A 2/2001
JP 2007-249712 A 9/2007

* cited by examiner

*Primary Examiner* — Paul Ip
(74) *Attorney, Agent, or Firm* — Kubotera & Associates LLC

(57) ABSTRACT

A voltage determination device includes a reference voltage generation circuit; a determination target voltage line; a first voltage line; a second voltage line; and a switching circuit disposed between the first voltage line and the second voltage line. The switching circuit is provided for performing a switching operation according to a level of the determination target voltage. The voltage determination device includes a determining circuit for determining the level of the determination target voltage, and a control unit is provided for controlling a level of an electric current flowing between the first voltage line and the second voltage line. The control unit controls a resistivity between the switching circuit and the second voltage line so that the level of the electric current is maintained at a specific level when the determining circuit determines the level of the determination target voltage.

13 Claims, 9 Drawing Sheets

VOLTAGE DETERMINATION DEVICE AND CLOCK CONTROL DEVICE

BACKGROUND OF THE INVENTION AND RELATED ART STATEMENT

The present invention relates to a voltage determination device capable of determining and identifying a level of a voltage, and a clock control device having the voltage determination device.

In general, in a clock, a motor generates a drive force to move a clock hand such as a second hand, a minute hand and an hour hand. A clock LSI (Large Scale Integration) is provided for controlling an operation of the clock hand. In order to move the clock hand with a minimum power, the clock LSI is configured to temporarily shut down a drive electric current supplied to the motor after a specific period of time (for example, a few milliseconds) after the clock LSI starts supplying the drive electric current to the motor. At this moment, when the clock hand moves, a counter electromotive voltage is generated. When the clock hand does not move, the counter electromotive voltage is not generated.

In the case that the clock hand does not move, it is necessary to supply the drive electric current to the motor for a prolonged period of time. Accordingly, in order to continuously control the operation of the clock hand, it is necessary for the clock LSI to determine whether the clock hand moves or not. As a method of determining whether the clock hand moves or not, there has been known a method of determining a level of the counter electromotive voltage generated in the motor.

In determining the level of the counter electromotive voltage, when a threshold value as a comparison reference becomes lower than a predetermined level, the level of the counter electromotive voltage may be erroneously determined due to a noise. More specifically, the clock LSI may determine that the clock hand moves even though the clock hand actually does not move. In this case, the clock LSI does not supply the drive electric current to the motor, so that the clock hand does not move. On the other hand, when the threshold value becomes higher than the predetermined level, the clock LSI may determine that the clock hand does not move even though the clock hand actually moves. In this case, the clock LSI supplies unnecessarily the drive electric current to the motor, so that power consumption increases.

Accordingly, in determining the level of the counter electromotive voltage, it is necessary to set the threshold value as the comparison reference at the most optimal level (within an acceptable range of the predetermined level). It should be noted that the optimal level may vary depending on the type of motor.

FIG. 8 is a circuit diagram showing a configuration of an NAND circuit 100 of a conventional voltage determination device. The NAND circuit 100 is disposed in a clock for determining the level of the counter electromotive voltage.

As shown in FIG. 8, the NAND circuit 100 includes P-channel type MOS field effect transistors 104 and 106 (referred to as PMOS transistors 104 and 106) and N-channel type MOS field effect transistors 108 and 110 (referred to as NMOS transistors 108 and 110). Further, the NAND circuit 100 includes a voltage line VDD to which a power source voltage is applied from a power source; an enable line EN to which a voltage is applied to selectively switch between an on state and an off state of each of the PMOS transistor 106 and the NMOS transistor 108; and an output terminal 112. A voltage corresponding to a comparison result obtained through comparing the level of the counter electromotive voltage with the threshold value is applied to the output terminal 112.

In the NAND circuit 100 with the configuration described above, when the power source thereof is shared with that of the clock LSI, according to the power source thus used (for example, a battery) and a motor 102, a gate length and a gate width of each of the PMOS transistor 104 and the NMOS transistor 108 are adjusted to control the threshold value.

As a size of the clock has been reduced, it is necessary to reduce the number of the batteries or the number of solar panels, thereby decreasing a voltage of generated power. Further, it may be necessary to use a rechargeable small secondary battery, thereby reducing the voltage of the power source of the clock LSI. Accordingly, it is necessary to adjust the threshold value in a wider voltage range of the power source. As a result, as the NAND circuit 100, when the power source thereof is shared with that of the clock LSI, the threshold value depends on the level of the voltage of the power source.

In the NAND circuit 100 of the conventional voltage determination device, when the threshold value is adjusted to a level near the voltage of the power source, it is necessary to significantly shift a ratio of abilities of following an electric current between the PMOS transistor 104 and the NMOS transistor 108.

More specifically, it is necessary to increase the gate width of the PMOS transistor 104, so that the ability of following the electric current in the PMOS transistor 104 is increased. Further, it is necessary to increase the gate length of the NMOS transistor 108, so that the ability of following the electric current in the NMOS transistor 108 is decreased. As a result, it is necessary to increase an area of the NAND circuit 100.

In order to reduce an area of a circuit, an NAND circuit 100A has been developed. FIG. 9 is a circuit diagram showing a configuration of the NAND circuit 100A of another conventional voltage determination device.

As shown in FIG. 9, the NAND circuit 100A includes a regulator 114 for maintaining the power source voltage applied to the voltage line VDD from the power source at a constant level. In the NAND circuit 100A, the power source voltage is maintained at the constant level to obtain a reference voltage, and the reference voltage is applied to a voltage line VSH. According, it is possible to apply the reference voltage to the voltage line ASH regardless of the power source voltage, so that the NAND circuit 100A utilizes the threshold value independent from the power source voltage.

When the NAND circuit 100A is adopted in the conventional voltage determination device, it is difficult to dispose a capacitance element with a sufficient capacity in the regulator 114, thereby making it difficult to further reduce the size of the clock LSI. When the capacitance element with the sufficient capacity is not disposed in the regulator 114, a through electric current is generated in the NAND circuit 100A when the counter electromotive voltage is applied to the gate terminal of each of the PMOS transistor 104 and the NMOS transistor 108. As a result, an output of the regulator 114 tends to rapidly drop, so that the threshold value is accordingly decreased.

In the description, the through electric current is referred to as an electric current flowing through a CMOS circuit (a switching circuit) formed of a combination of, for example, a PMOS transistor and an NMOS transistor (for example, refer to Patent Reference No. 1 and Patent Reference No. 2).

Patent Reference No. 1: Japanese Patent Publication No. 2001-044822

Patent Reference No. 2: Japanese Patent Publication No. 2007-249712

In the NAND circuit 100A shown in FIG. 9, when a signal level of a signal input from the motor 102 to the NAND circuit 100A as the counter electromotive voltage is switched from a low level to a high level, or from the high level to the low level, each of the PMOS transistor 104 and the NMOS transistor 108 becomes the on state for a specific period of time. As a result, the through electric current flows from the voltage line ASH to a ground line GND.

When the NAND circuit 100A shown in FIG. 9 is adopted in the conventional voltage determination device, the following problem may occur. The problem will be described below with reference to FIGS. 10 and 11. FIG. 10 is a circuit diagram showing a configuration of the regulator 114 of the NAND circuit 100A of the conventional voltage determination device. FIG. 11 is a graph showing a change in the threshold value of the NAND circuit 100A of the conventional voltage determination device.

As shown in FIG. 10, the regulator 114 includes an operation amplifier 116, a PMOS transistor 118, a constant electric current source 120, and a capacitor 122. In general, the capacitor 122 is disposed in the regulator 114 for releasing electric charges to switch the PMOS transistor 118 to the on state even when a load electric current is generated when the PMOS transistor 118 is in the off state, thereby delaying the switching operation.

In the regulator 114, when the load electric current does not exist on the side of the voltage line VAH, the PMOS transistor 118 is in the off state. When an excessive load electric current is generated on the side of the voltage line VAH due to the through electric current, since the PMOS transistor 118 is in the off state, an electric current is temporarily applied to the voltage line VSH according to a capacity accumulated in the capacitor 122.

In the regulator 114, as described above, it is difficult to secure a sufficient area for the capacitor 122, so that the capacity of the capacitor 122 is limited. Accordingly, after the capacity of the capacitor 122 is exhausted, until the PMOS transistor 118 is turned on, the voltage applied to the voltage line VSH from the regulator 114 is temporarily dropped as indicated with solid lines in FIG. 11. As a result, as shown in FIG. 11, the threshold value drops rapidly.

In order to solve the problems of the NAND circuit 100A described above, another configuration of the regulator 114 has been developed. FIG. 12 is a circuit diagram showing the configuration of the regulator 114 of the NAND circuit 100A of the conventional voltage determination device.

As shown in FIG. 12, the output terminal of the regulator is disposed outside as the terminal of the clock LSI, and a capacitor 124 with a sufficient capacity is connected to the output terminal. As indicated with hidden lines in FIG. 11, when the capacitor 124 is disposed on the output side of the regulator 114, it is possible to prevent the output of the regulator 114 from rapidly dropping, as well as prevent the threshold value from rapidly dropping. However, when the capacitor 124 is disposed on the output side of the regulator 114, it is necessary to increase a mounting area due to an increase in the number of the components.

In order to solve the problems of the NAND circuit 100A without disposing the capacitor 124, in the NAND circuit 100A shown in FIG. 9, an electric current load may be connected to the output side of the regulator 114, so that an electric current flows to the ground line GND all the time. Accordingly, it is possible to prevent the PMOS transistor 118 of the regulator 114 from switching temporarily from the on state to the off state. In this case, it is possible to prevent the mounting area from increasing due to the additional capacitor. However, it is difficult to prevent the power consumption from increasing.

As described above, when the conventional voltage determination device is provided for determining the level of the counter electromotive voltage for controlling the operation of the clock hand, the above problems tend to occur. As long as any device for determining a level of a target voltage uses a circuit having a switching circuit through which the through electric current flows (for example, an NAND circuit, an AND circuit, an OR circuit, and an NOR circuit), the above problems tend to occur.

In view of the problems described above, an object of the present invention is to provide a voltage determination device and a clock control device capable of solving the problems of the conventional voltage determination device. In the present invention, it is possible to accurately determine a level of a target voltage while minimizing an increase in a circuit size or power consumption.

Further objects and advantages of the invention will be apparent from the following description of the invention.

SUMMARY OF THE INVENTION

In order to attain the objects described above, according to a first aspect of the present invention, a voltage determination device includes a reference voltage generation circuit for generating a first reference voltage having a specific level; a determination target voltage line to which a determination target voltage is applied; a first voltage line to which the first reference voltage generated with the reference voltage generation circuit is applied; a second voltage line to which a second reference voltage having a level different from the specific level of the first reference voltage is applied; and a switching circuit disposed between the first voltage line and the second voltage line for connecting the first voltage line and the second voltage line. The switching circuit is provided for performing a switching operation according to a level of the determination target voltage applied to the determination target voltage line.

According to the first aspect of the present invention, the voltage determination device further includes a determining circuit for comparing the level of the determination target voltage applied to the determination target voltage line with a threshold value voltage to determine the level of the determination target voltage. The voltage determination device further includes a control unit is provided for controlling a level of the electric current flowing between the first voltage line and the second voltage line. More specifically, the control unit is provided for controlling a resistivity between the switching circuit and the second voltage line so that the level of the electric current flowing between the first voltage line and the second voltage line is maintained at a specific level when the control unit controls the determining circuit to determine the level of the determination target voltage, including a timing when the determination target voltage is applied to the determination target voltage line.

According to a second aspect of the present invention, a clock control device includes the voltage determination device in the first aspect. In the second aspect of the present invention, the determination target voltage corresponds to a counter electromotive voltage generated in a motor when a drive current supplied to the motor for moving a clock hand is shut down.

In the present invention, it is possible to accurately determine the level of the termination target voltage while minimizing an increase in a circuit size or power consumption.

DETAILED DESCRIPTION OF PREFERRED EMBODIMENTS

Hereunder, preferred embodiments of the present invention will be explained with reference to the accompanying drawings.

First Embodiment

Figure 1:
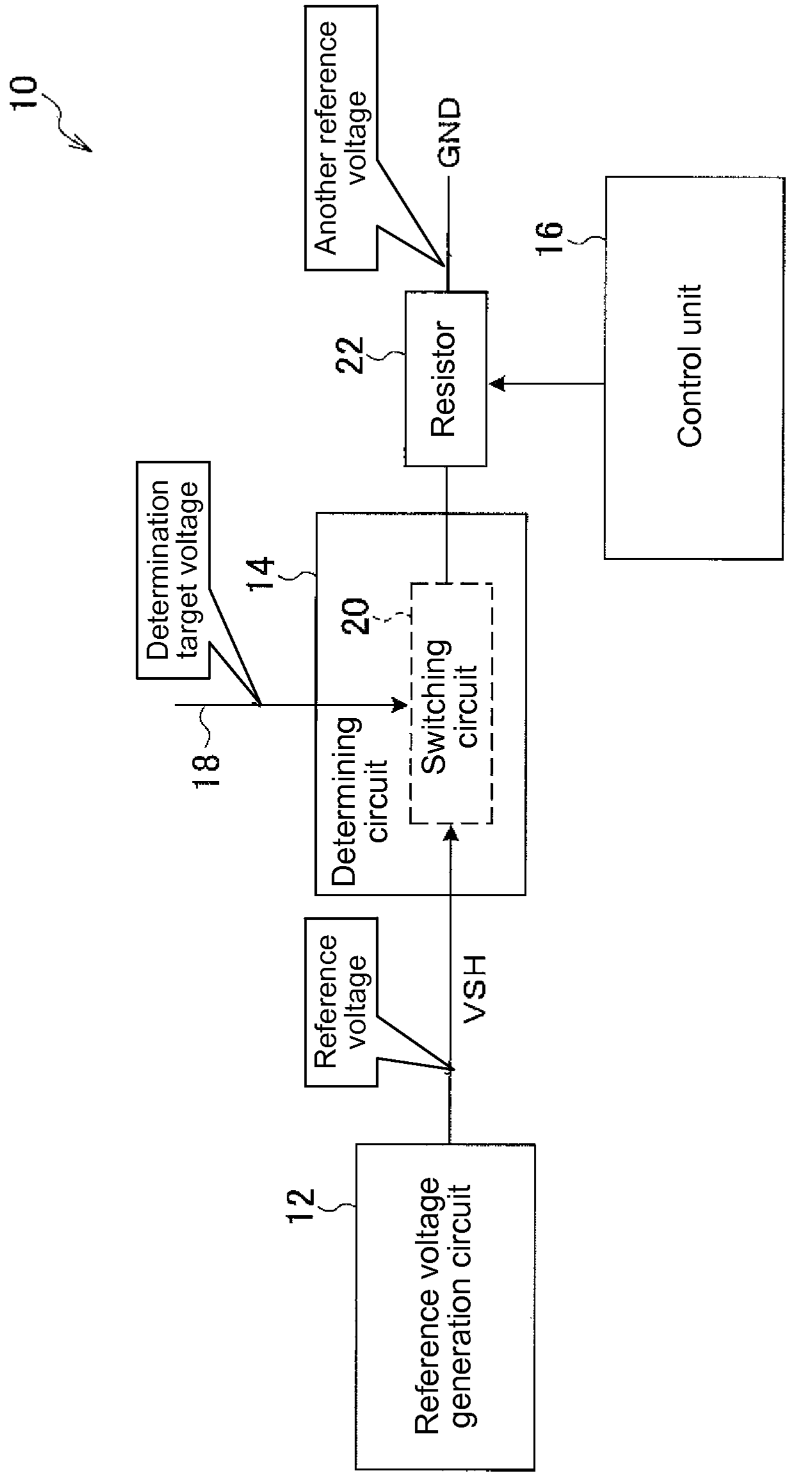
FIG. 1 is a block diagram showing a configuration of a voltage determination device according to a first embodiment of the present invention.

A first embodiment of the present invention will be explained. FIG. 1 is a block diagram showing a configuration of a voltage determination device 10 according to the first embodiment of the present invention. As shown in FIG. 1, the voltage determination device 10 includes a reference voltage generation circuit 12; a determining circuit 14; and a control unit 16.

In the embodiment, the reference voltage generation circuit 12 is provided for generating a reference voltage having a specific level. The determining circuit 14 includes a determination target voltage line 18 and a switching circuit 20. The switching circuit 20 is disposed between a voltage line VSH and a ground line GND, so that the voltage line VSH is electrically connected to the ground line GND. The reference voltage generated with the reference voltage generation circuit 12 is applied to the voltage line VSH. A ground voltage as another reference voltage different from the reference voltage is applied to the ground line GND. Further, the switching circuit 20 is provided for performing a switching operation according to a level of a determination target voltage applied to the determination target voltage line 18.

In the embodiment, the determining circuit 14 is provided for comparing the level of the determination target voltage with a threshold value, so that the determining circuit 14 determines the level of the determination target voltage. The control unit 16 is provided for controlling a level of an electric current flowing between the voltage line VSH and the ground line GND.

More specifically, the control unit 16 is provided for controlling a level of a resistor 22 between the switching circuit 20 and the ground line GND, so that the level of the electric current flowing between the voltage line VSH and the ground line GND is maintained at a specific level when the control unit 16 controls the determining circuit 14 to determine the level of the determination target voltage.

In the following description, the voltage determination device 10 is adapted to a clock control device for controlling an operation of a clock hand. In this case, the voltage determination device 10 is provided for determining a level of a counter electromotive voltage generated in a motor that generates a drive force to move the clock hand.

Figure 2:
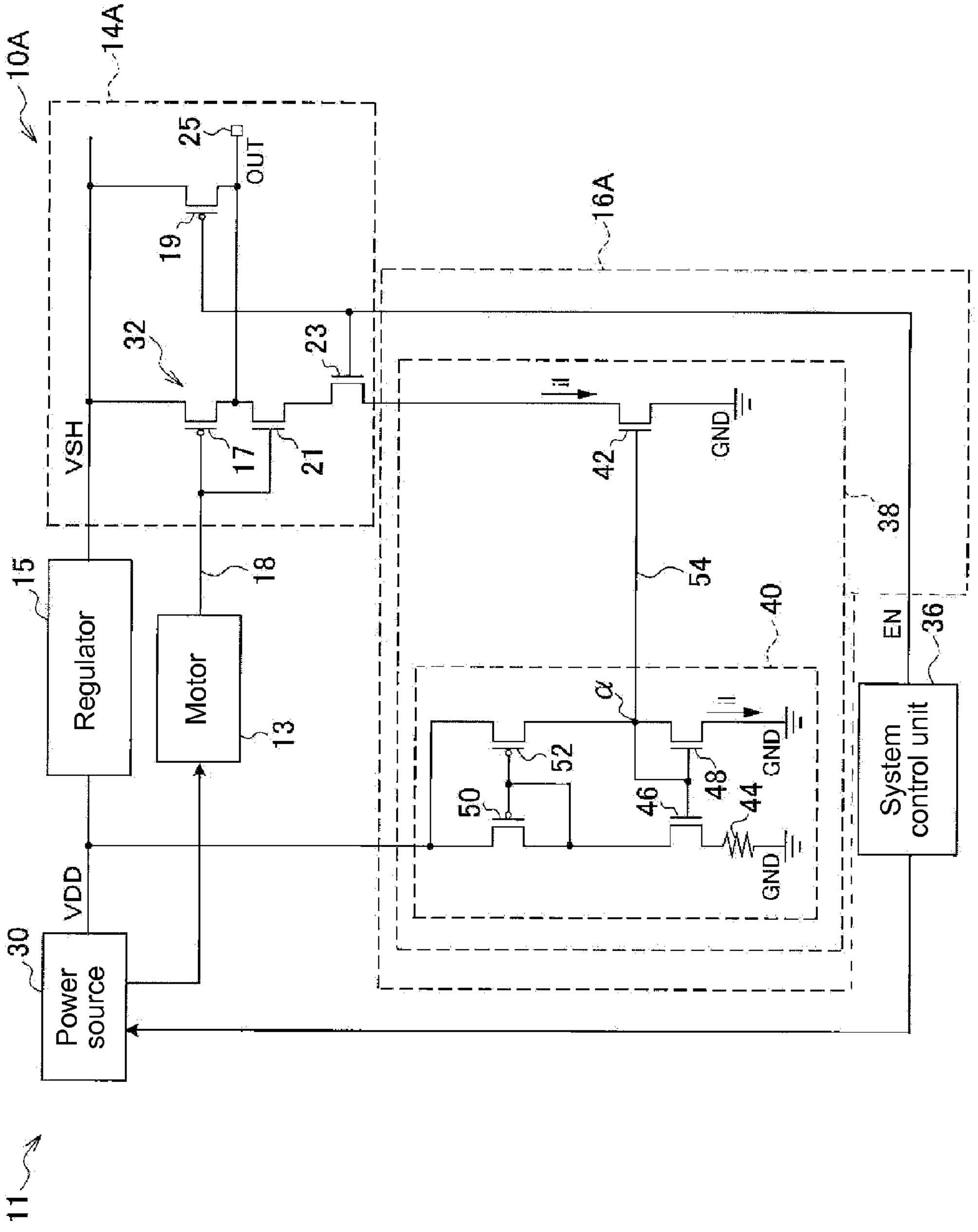
FIG. 2 is a block diagram showing a configuration of a clock control device according to the first embodiment of the present invention.

FIG. 2 is a block diagram showing a configuration of a clock control device 11 according to the first embodiment of the present invention. As shown in FIG. 2, a voltage determination device 10A is disposed in the clock control device 11 as a specific example of the voltage determination device 10.

As shown in FIG. 2, in addition to the voltage determination device 10A, the clock control device 11 includes a power source 30 and a motor 13. The motor 13 is connected to the power source 30, so that a drive voltage is applied to the motor 13 from the power source 30. A drive shaft (not shown) of the power source 30 is connected to a rotational shaft of the clock hand of the clock (not shown), so that the drive force is transmitted from the motor 13 to the clock hand. Accordingly, the clock hand moves through receiving the drive force generated in the motor 13.

In the embodiment, the voltage determination device 10A includes a regulator 15, an NAND circuit 14A, and a control unit 16A. It is noted that the NAND circuit 14A functions as the determining circuit 14 shown in FIG. 1. The control unit 16A is provided for controlling the power source 30, so that the control unit 16A controls the motor 13 to drive the clock hand. It is noted that the control unit 16A functions as the control unit 16 shown in FIG. 1.

In the embodiment, the regulator 15 functions as the reference voltage generation circuit 12 shown in FIG. 1, and is connected to the power source 30 through a voltage line VDD. Further, the regulator 15 is connected to the NAND circuit 14A through the voltage line VSH.

In the embodiment, the NAND circuit 14A is connected to the motor 13 through the determination target voltage line 18. Further, the NAND circuit 14A is connected to the control unit 16A. The control unit 16A is connected to the voltage line VDD, so that a power source voltage is applied to the control unit 16A from the power source 30. Further, the control unit 16A is connected to the power source 30, so that the control unit 16A is capable of controlling the power source 30. The motor 13 is connected to the power source 30, so that the drive voltage is applied to the motor 13 from the power source 30.

Figure 10:
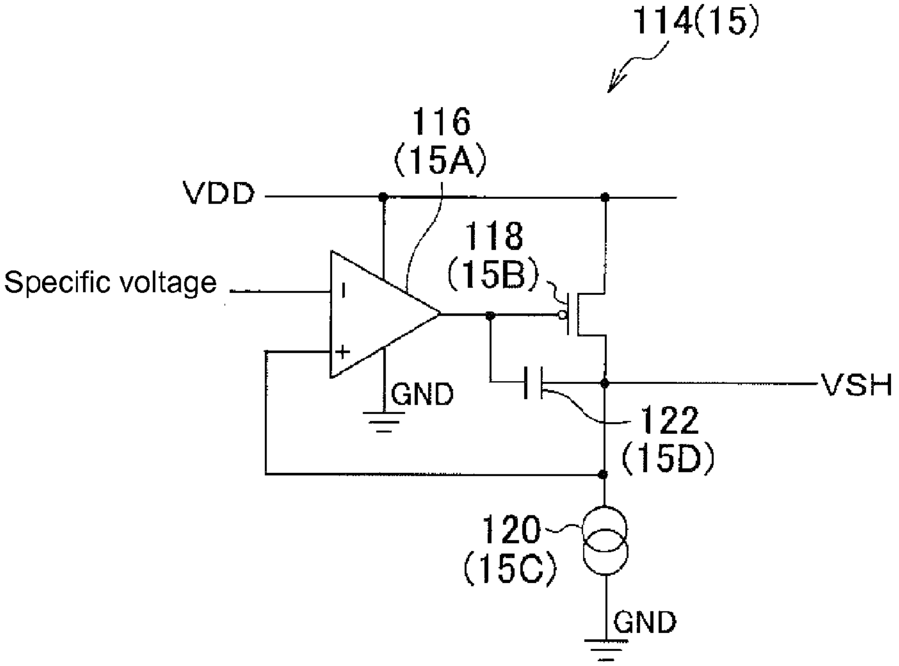
FIG. 10 PRIOR ART
FIG. 10 is a circuit diagram showing a configuration No. 1 of a regulator of the conventional voltage determination device.
Figure 11:
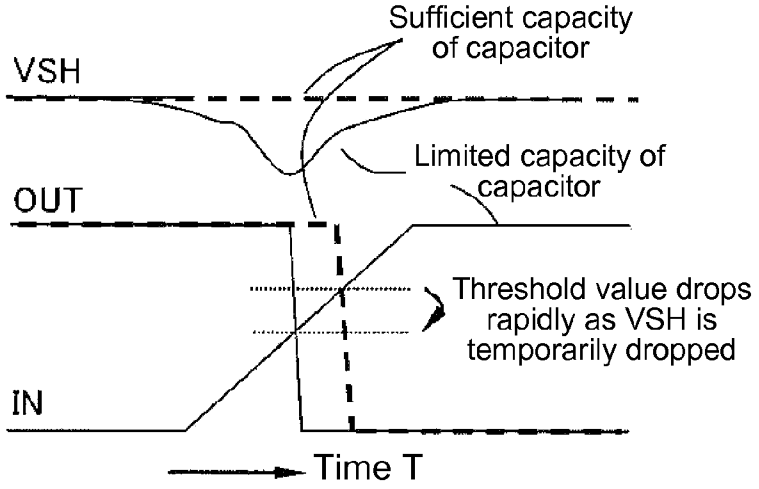
FIG. 11 PRIOR ART
FIG. 11 is a graph showing a change in a threshold value of the NAND circuit of the conventional voltage determination device.
Figure 12:
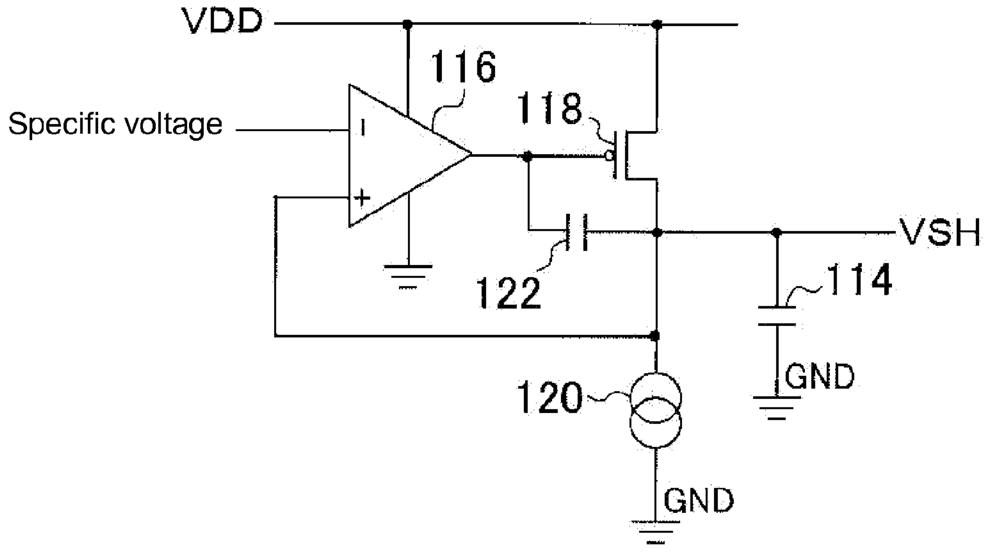
FIG. 12 PRIOR ART
FIG. 12 is a circuit diagram showing a configuration No. 2 of the regulator of the conventional voltage determination device.

In the embodiment, the regulator 15 may have a configuration similar to that shown in FIG. 10 as an example. In this case, the regulator 15 includes an operation amplifier 15A, a PMOS transistor 15B, a constant electric current source 15C, and a capacitor 15D. A source terminal of the PMOS transistor 15B is connected to the voltage line VDD. A drain terminal of the PMOS transistor 15B is connected to one terminal of the constant electric current source 15C, one electrode of the capacitor 15D, and the voltage line VSH. The other terminal of the constant electric current source 15C is connected to the ground line VDD.

In the embodiment, a non-inversion input terminal of the operation amplifier 15A is connected to the drain terminal of the PMOS transistor 15B. An output terminal of the operation amplifier 15A is connected to a gate terminal of the PMOS transistor 15B and the other electrode of the capacitor 15D. A specific voltage (having a constant level) is applied to an inversion input terminal of the operation amplifier 15A. Further, the operation amplifier 15A is connected to the voltage line VDD and the ground line GND, so that the drive voltage is applied to the operation amplifier 15A from the power source 30 through the voltage line VDD.

As shown in FIG. 2 as an example, the NAND circuit 14A includes a CMOS circuit 32 functioning as the switching circuit 20 shown in FIG. 1; a PMOS transistor 19 as a second switching portion; an NMOS transistor 23 as a first switching portion; and an output terminal 25 for outputting a signal corresponding to a comparison result between the level of the counter electromotive voltage and the level of the threshold value voltage.

In the embodiment, the CMOS circuit 32 includes a PMOS transistor 17 as a first switching element and an NMOS transistor 21 as a second switching element. A source terminal of the PMOS transistor 17 is connected to the voltage line VSH; a drain terminal of the PMOS transistor 17 is connected to a drain terminal of the NMOS transistor 21; and a gate terminal of the PMOS transistor 17 is connected to the motor 13 through the determination target voltage line 18, so that the counter electromotive voltage of the motor 13 is applied to the gate terminal of the PMOS transistor 17.

In the embodiment, a source terminal of the NMOS transistor 21 is connected to a drain terminal of the NMOS transistor 23, and a gate terminal of the NMOS transistor 21 is connected to the motor 13 through the determination target voltage line 18, so that the counter electromotive voltage of the motor 13 is applied to the gate terminal of the NMOS transistor 21. A connection point of the drain terminal of the PMOS transistor 17 and the drain terminal of the NMOS transistor 21 is connected to the output terminal 25 through a wiring portion OUT as a third voltage line. A source terminal of the PMOS transistor 19 is connected to the voltage line VSH, and a drain terminal of the PMOS transistor 19 is connected to the wiring portion OUT.

In the embodiment, the clock control device 11 includes a system control unit 36. The system control unit 36 may be a general-purpose computer formed of a CPU (Central Processing Unit) for executing a specific program to control an entire operation of the clock control device 11; an ROM (Read Only Memory) as a storage medium for storing a control program for controlling a basic operation of the clock control device 11 and a voltage determination instruction process program (described later); an RAM (Random Access Memory) as a storage medium used as a work area upon executing various programs; a non-volatile memory; and the like.

In the embodiment, the system control unit 36 is connected to the power source 30. Further, the system control unit 36 is connected to the gate terminal of the PMOS transistor 19 and the gate terminal of the NMOS transistor 23 through an enable line EN. Accordingly, the system control unit 36 is capable of controlling the power source 30 as well as controlling the switching operation of the PMOS transistor 19 and the NMOS transistor 23 of the NAND circuit 14A.

In the embodiment, the control unit 16A includes a current mirror circuit 38 and a reference current generation circuit 40. The current mirror circuit 38 includes the reference current generation circuit 40 and an NMOS transistor 42 as a third switching element. The reference current generation circuit 40 is provided for generating a reference current i1 having a specific level according to the power source voltage applied from the power source 30 through the voltage line VDD.

In the embodiment, the reference current generation circuit 40 includes a resistor 44, an NMOS transistor 46, an NMOS transistor 48, a PMOS transistor 50, and a PMOS transistor 52. One end portion of the resistor 44 is connected to the ground line GND, and the other end portion of the resistor 44 is connected to a source terminal of the NMOS transistor 46. A drain terminal of the NMOS transistor 46 is connected to a drain terminal of the PMOS transistor 50. A source terminal of the PMOS transistor 50 is connected to the voltage line VDD, and a gate terminal of the PMOS transistor 50 is connected to a gate terminal of the PMOS transistor 52 and the drain terminal of the PMOS transistor 50.

In the embodiment, a source terminal of the NMOS transistor 48 is connected to the ground line GND, and a gate terminal of the NMOS transistor 48 is connected to the gate terminal of the NMOS transistor 46 and a drain terminal of the NMOS transistor 48. A drain terminal of the PMOS transistor 52 is connected to the drain terminal of the NMOS transistor 48, and a source terminal of the PMOS transistor 52 is connected to the voltage line VDD.

In the embodiment, the current mirror circuit 38 includes a wiring portion 54 as a constant voltage line to which a constant voltage corresponding to the reference current i1 is applied. The wiring portion 54 is disposed over both the reference current generation circuit 40 and the current mirror circuit 38, so that a connection point a between the drain terminal of the NMOS transistor 48 and the drain terminal of the PMOS transistor 52 is connected to a gate terminal of the NMOS transistor 42 through the wiring portion 54 as the constant voltage line. A source terminal of the NMOS transistor 42 is connected to the ground line GND, and a drain terminal of the NMOS transistor 42 is connected to the source terminal of the CMOS circuit 32.

As described above, in the control unit 16A, the connection point a between the reference current generation circuit 40 and the gate terminal of the NMOS transistor 42 disposed between the NMOS transistor 23 and the ground line is configured to achieve a current mirror connection. Accordingly, a mirror current corresponding to the reference current i1 flows between the source terminal and the drain terminal of the NMOS transistor 42.

In the embodiment shown in FIG. 2, the mirror current has a level the same as that of the reference current i1. Alternatively, the current mirror ratio may be changed, so that the mirror current may have a level different from that of the reference current i1.

In the voltage determination device 10A with the configuration described above, when the resistor 22 disposed between the switching circuit 20 and the ground line shown in FIG. 1, that is, an on resistivity of the NMOS transistor 42 shown in FIG. 2, is adjusted, it is possible to control the level of the electric current (an electric current amount) flowing between the voltage line VSH and the ground line GND. As a result, the mirror current corresponding to the reference current i1 flows between the voltage line VSH and the ground line GND.

An operation of the clock control device 11 will be explained next. In order to move the clock hand of the clock, when the current is supplied from the power source 30 to the motor 13 according to an instruction of the system control unit 36, the motor 13 is started driving. After the operation of the clock hand starts, when the current supplied to the motor 13 stops according to an instruction of the system control unit 36 after a specific period of time (for example, a few milliseconds) after the current starts being supplied from the power source 30 to the motor 13, the motor 13 stops driving, thereby stopping the operation of the clock hand. When the operation of the clock hand is stopped, the counter electromotive voltage is generated in the motor 13.

In the embodiment, the NAND circuit 14A is provided for determining the level of the counter electromotive voltage (for example, determining whether the level of the counter electromotive voltage exceeds the threshold value). Accordingly, the signal is output from the output terminal 25 according to the voltage indicating the comparison result. As a result, it is possible to determine whether the clock hand moves.

If the through electric current flows in the CMOS circuit 32 during a period of time when the NAND circuit 14A determines the level of the counter electromotive voltage (including a timing when the counter electromotive voltage is applied to the determination target voltage line 18), the threshold value may fluctuate. In this case, it is difficult to accurately determine the level of the counter electromotive voltage.

To this end, in the embodiment, when the NAND circuit 14A determines the level of the counter electromotive voltage, the voltage determination device 10A performs a voltage determination instruction process, so that the NAND circuit 14A is specifically instructed to determine the level of the counter electromotive voltage.

Figure 3:
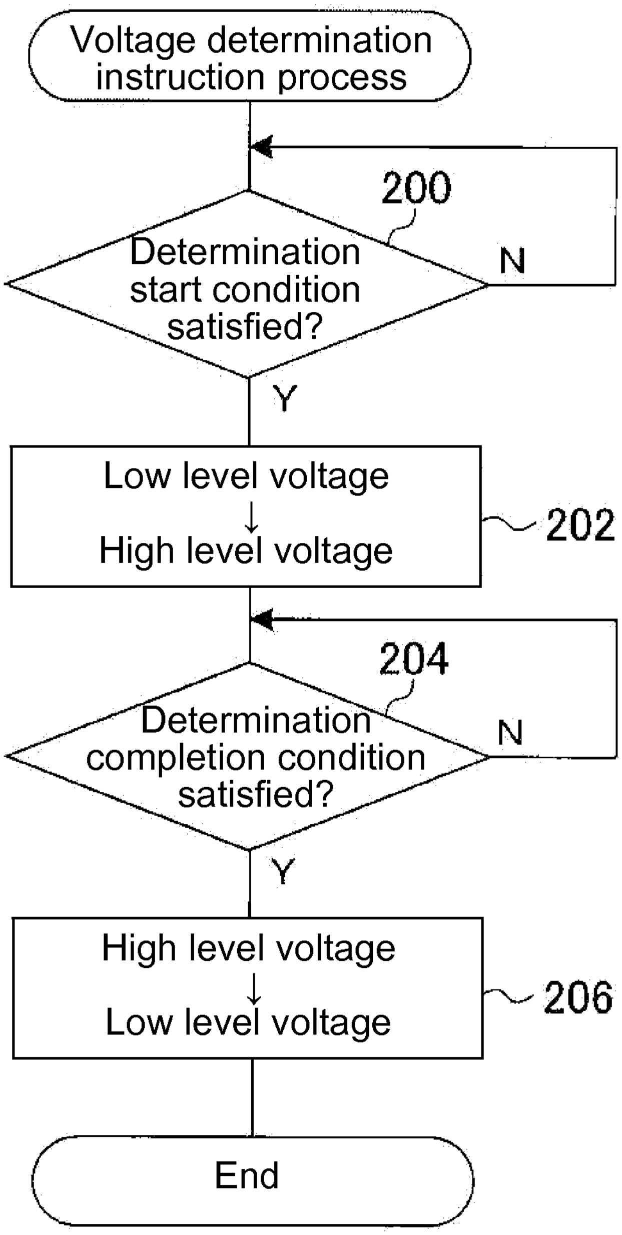
FIG. 3 is a flow chart showing an operation of the voltage determination device in a voltage determination instruction process according to the first embodiment of the present invention.

The voltage determination instruction process of the voltage determination device 10A will be explained next with reference to FIG. 3. FIG. 3 is a flow chart showing the operation of the voltage determination device 10A in the voltage determination instruction process according to the first embodiment of the present invention.

In the following description, to make the explanation simple, it is supposed that the voltage determination instruction process starts in an initial state, in which a low level voltage (a voltage capable of changing to a high level voltage) is applied to the enable line EN.

As shown in FIG. 3, in step 200, the voltage determination device 10A waits until a determination start condition for starting the voltage determination instruction process is satisfied. The determination start condition may include a condition whether a specific period of time is elapsed as a time for generating the counter electromotive voltage after the system control unit 36 instructs the motor 13 to start driving. Alternatively, the determination start condition may include a condition whether it reaches a specific timing set in advance when the counter electromotive voltage is generated. It is noted that the specific timing set in advance comes every time when the specific period of time (for example, a few milliseconds) is elapsed.

When the voltage determination device 10A determines that the determination start condition is satisfied in step 200, the process proceeds to step 202. In step 202, the low level voltage is changed to the high level voltage. In this case, the low level voltage applied to the enable line EN as a period signal has a determination period level, and the high level voltage has a non-determination period level. After the low level voltage is changed to the high level voltage, the process proceeds to step 204. In the NAND circuit 14A, according to the process in step 202, the PMOS transistor 19 is switched from the on state to the off state, and the NMOS transistor 23 is switched from the off state to the on state. Accordingly, the level of the voltage applied to the output terminal 25, that is, a signal level of a signal output from the output terminal 25, is changed according to the level of the voltage applied to the determination target voltage line 18.

In the embodiment, the NAND circuit 14A sets the threshold value through the following process. As described above, the threshold value becomes the comparison subject relative to the level of the counter electromotive voltage when the level of the counter electromotive voltage is determined. In the following explanation, it is supposed that the level of the reference voltage applied to the voltage line VSH is 1.3 V, and the NAND circuit 14A sets the threshold value at 1.0 V.

In this case, the NMOS transistor 21 is formed such that the gate length and the gate width of the NMOS transistor 21 are adjusted such that the electric current greater than 10 μA can flow at the voltage (the gate voltage) applied to the gate terminal thereof of 0.5 V. As a result, when the threshold value is 1.0 V, similar to the NMOS transistor 23, the NMOS transistor 21 is switched to the on state. Accordingly, similar to the NMOS transistor 23, the NMOS transistor 21 is not affected by the threshold value.

Figure 4:
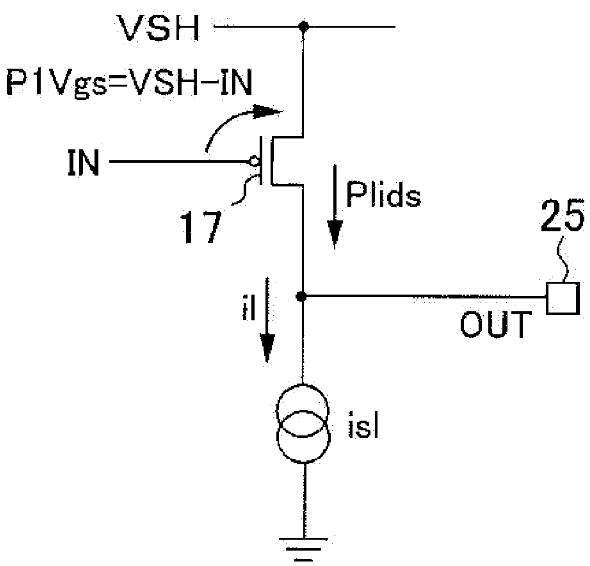
FIG. 4 is a circuit diagram showing an equivalent circuit of the voltage determination device according to the first embodiment of the present invention.

Further, the NMOS transistor 21 and the NMOS transistor 23 are configured such that the on resistivity thereof is set at a small value to be negligible relative to the threshold value of 1.0 V. Accordingly, the NAND circuit 14A can be represented as an equivalent circuit having a constant current source iS1 as shown in FIG. 4 as an example. FIG. 4 is a circuit diagram showing the equivalent circuit of the voltage determination device 14A according to the first embodiment of the present invention.

Further, in this case, the PMOS transistor 17 is formed such that the dimension of the PMOS transistor 17 is adjusted so that an electric current P1*ids* between the source terminal and the drain terminal becomes 100 μA can flow at a voltage P1Vds between the gate terminal and the source terminal of 0.3 V. When the level of the reference voltage applied to the voltage line VHS is 1.3 V, and the level of the voltage applied to the determination target voltage line 18 is 1.0 V, the voltage P1Vds between the gate terminal and the source terminal of the PMOS transistor 17 becomes 0.3 V (1.3 V−1.0 V=0.3 V). It is noted that the determination target voltage line 18 is represented as the determination target voltage line IN shown in FIG. 4.

In the PMOS transistor 17, the level of the electric current P1*ids* flowing between the source terminal and the drain terminal thereof is correlated to the level of the voltage P1Vds between the gate terminal and the source terminal thereof. Accordingly, the electric current P1*ids* flowing between the source terminal and the drain terminal of the PMOS transistor 17 has a maximum value of 100 μA. Further, the constant current iS1 is set such as the maximum value of 100 μA can flow regardless of the level of the voltage applied to the drain terminal of the NMOS transistor 21.

Figure 5:
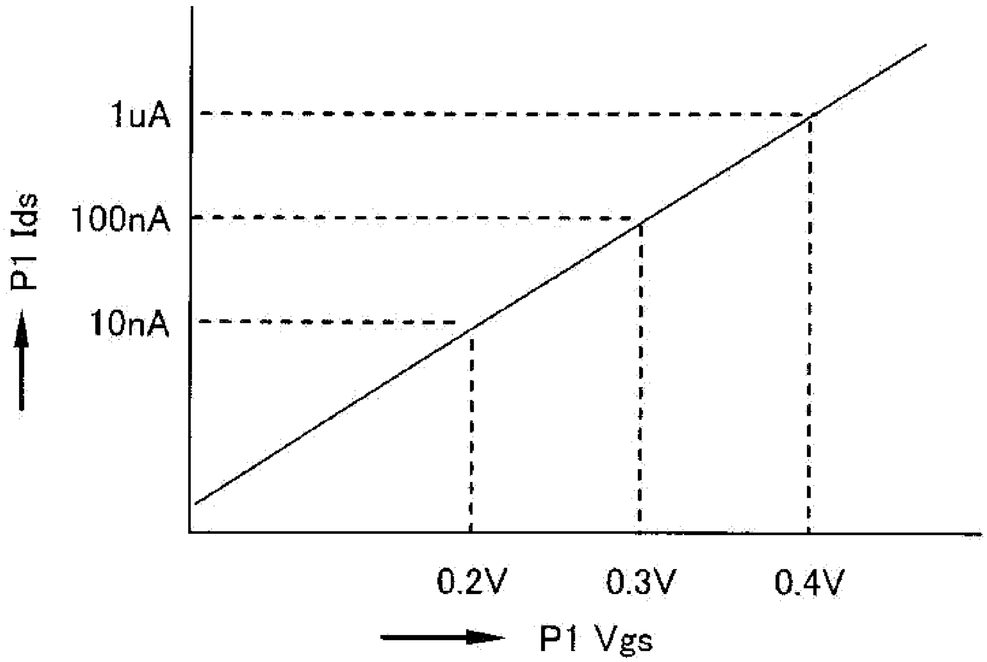
FIG. 5 is a graph showing a relationship between a level of a voltage between a gate terminal and a source terminal of a PMOS transistor of a CMOS circuit of the voltage determination device and a maximum level of an electric current between the source terminal and a drain terminal of the PMOs transistor of the CMOS circuit according to the first embodiment of the present invention.

FIG. 5 is a graph showing a relationship between the level of the voltage p1Vgs between the gate terminal and the source terminal of the PMOS transistor 17 of the CMOS circuit 32 of the voltage determination device 11 and the maximum level of the electric current P1*ids* between the source terminal and the drain terminal of the PMOs transistor 17 of the CMOS circuit 32 according to the first embodiment of the present invention.

As shown in FIG. 5, when the level of the voltage applied to the voltage line VSH is 1.3 V, and the level of the voltage applied to the determination target voltage line 18 is 1.0V, it is possible to flow the electric current P1*ids* of 100 μA between the source terminal and the drain terminal of the PMOS transistor 17. The level of the electric current P1*ids* is equivalent to the level of the electric current flowing from the source terminal of the NMOS transistor 21 to the ground line GND through the NMOS transistor 23 and the NMOS transistor 42. Accordingly, in theory, the level of the reference voltage applied to the voltage line VSH is divided in half between the PMOS transistor 17, and the NMOS transistor 21, the NMOS transistor 23, and the NMOS transistor 42. The half of the level of the reference voltage applied to the voltage line VSH is applied to the output terminal 25.

When the level of the voltage applied to the determination target voltage line 18 becomes greater than 1.0 V, the level of the voltage p1Vgs between the gate terminal and the source terminal of the PMOS transistor 17 becomes smaller than 0.3 V. Accordingly, the maximum value of the electric current P1*ids* between the source terminal and the drain terminal of the PMOS transistor 17 becomes smaller than 100 μA as shown in FIG. 5.

Further, the maximum level of the constant current iS1 flowing from the source terminal of the NMOS transistor 21 to the ground line GND through the NMOS transistor 23 and the NMOS transistor 42 remains 100 μA. Accordingly, the PMOS transistor 17 lowers the ability of flowing the electric current relative to the ability of flowing the electric current of the NMOS transistor 21, the NMOS transistor 23, and the NMOS transistor 42. As a result, the level of the voltage applied to the output terminal 25 becomes smaller than the half of the level of the reference voltage applied to the voltage line VSH.

On the other hand, when the level of the voltage applied to the determination target voltage line 18 becomes smaller than 1.0 V, the level of the voltage p1Vgs between the gate terminal and the source terminal of the PMOS transistor 17 becomes greater than 0.3 V. Accordingly, the maximum value of the electric current P1*ids* between the source terminal and the drain terminal of the PMOS transistor 17 becomes greater than 100 μA as shown in FIG. 5.

Further, the maximum level of the constant current iS1 flowing from the source terminal of the NMOS transistor 21 to the ground line GND through the NMOS transistor 23 and the NMOS transistor 42 remains 100 μA. Accordingly, the PMOS transistor 17 increases the ability of flowing the electric current relative to the ability of flowing the electric current of the NMOS transistor 21, the NMOS transistor 23, and the NMOS transistor 42. As a result, the level of the voltage applied to the output terminal 25 becomes greater than the half of the level of the reference voltage applied to the voltage line VSH.

In step 204, the voltage determination device 10A waits until a determination completion condition for completing the voltage determination instruction process is satisfied. The determination completion condition may include a condition whether a specific period of time is elapsed as a time for completing the determination of the level of the counter electromotive voltage after the system control unit 36 instructs the motor 13 to start driving and the counter electromotive voltage is generated. Alternatively, the determination completion condition may include a condition whether it reaches a specific timing set in advance when the level of the counter electromotive voltage is completely determined.

When the voltage determination device 10A determines that the determination completion condition is satisfied in step 204, the process proceeds to step 206. In step 206, the voltage applied to the enable line EN is changed from the high level voltage to the low level voltage, thereby completing the voltage determination instruction process. In the NAND circuit 14A, according to the process in step 206, the PMOS transistor 19 is switched from the off state to the on state, and the NMOS transistor 23 is switched from the on state to the off state.

As explained above, in the voltage determination device 10A in the first embodiment, the regulator 15 is provided for supplying the reference voltage to the NAND circuit 14A, and the constant current source is1 is disposed between the NMOS transistor 21 of the NAND circuit 14A and the ground line GND. Accordingly, it is possible to control the through electric current of the CMOS circuit 32 at the constant level when the counter electromotive voltage is applied. As a result, with the regulator 15, it is possible to prevent the level of the reference voltage to be applied to the voltage line VSH from temporarily dropping.

Accordingly, in the first embodiment, it is possible to maintain the threshold value used in the NAND circuit 14A at the constant level, regardless of the level of the power source voltage supplied to the regulator 15. Further, through adjusting the constant current source is1, it is possible to easily adjust the fluctuation in the threshold value due to a manufacturing variance of the elements (for example, the PMOS transistor 17 and the NMOS transistor 21) constituting the CMOS circuit 32.

Further, in the first embodiment, when the threshold value used in the NAND circuit 14A is set to a value similar to the level of the power source voltage, it is not necessary to significantly shift the ratio between the ability of the PMOS transistor 17 for flowing the electric current and the ability of the NMOS transistor 21 for flowing the electric current. Accordingly, it is possible to minimize the circuit area.

Further, in the first embodiment, the constant current flows toward the ground line GND. Accordingly, it is possible to reduce the through electric current down to about a few tens or a few hundreds of nA, as opposed to a few tend of μA of the conventional NAND circuit, thereby reducing the power consumption. Further, it is possible to minimize the capacity of the capacitor 15D disposed on the output side of the regulator 15 down to a few pF. Accordingly, it is not necessary to provide a capacitor with a capacity of about 1,000 pF necessary for the conventional circuit. As a result, it is possible to minimize the number of the terminals or the peripheral components, thereby reducing the cost and the mounting area.

Further, in the voltage determination device 10A in the first embodiment, the reference current generation circuit 40 and the regulator 15 shear the power source 30. Accordingly, it is possible to reduce the size of the clock control device 11.

Second Embodiment

A second embodiment of the present invention will be explained next. In the following description, a configuration of a clock control device 11A in the second embodiment that is different from that of the clock control device 11 in the first embodiment will be mainly explained.

Figure 6:
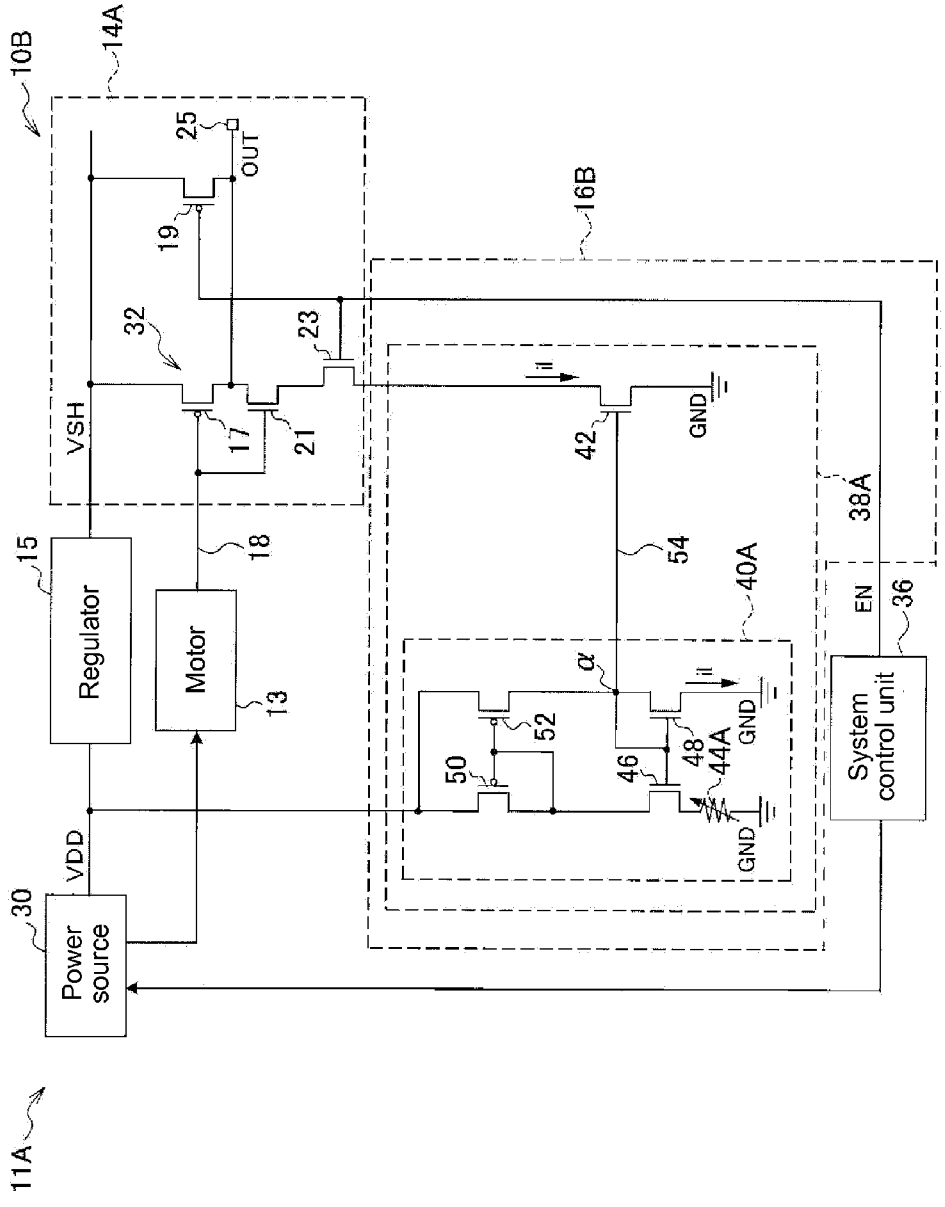
FIG. 6 is a block diagram showing a configuration of a clock control device according to a second embodiment of the present invention.

FIG. 6 is a block diagram showing the configuration of the clock control device 11A according to the second embodiment of the present invention. As shown in FIG. 6, as opposed to the clock control device 11 in the first embodiment, the clock control device 11A includes a voltage determination device 10B instead of the voltage determination device 10A.

In the embodiment, as opposed to the voltage determination device 10A in the first embodiment, the voltage determination device 10B includes a control unit 16B instead of the control unit 16A. As opposed to the control unit 16A in the first embodiment, the control unit 16B includes a current mirror circuit 38A instead of the current mirror circuit 38. Further, as opposed to the current mirror circuit 38 in the first embodiment, the current mirror circuit 38A includes a reference current generation circuit 40A instead of the reference current generation circuit 40. Further, as opposed to the reference current generation circuit 40 in the first embodiment, the reference current generation circuit 40A includes a variable resistor 44A instead of the resistor 44.

In the voltage determination device 10B of the clock control device 11A having the configuration described above, when the resistivity of the variable resistor 44A is decreased, the reference current i1 flowing between the source terminal and the drain terminal of the NMOS transistor 48 is increased. Accordingly, the mirror current flowing between the source terminal and the drain terminal of the NMOS transistor 42 that is connected to the connection point ∝ in through the mirror connection is increased. As a result, it is possible to decrease the threshold value used in the NAND circuit 14A.

On the other hand, when the resistivity of the variable resistor 44A is increased, the reference current i1 flowing between the source terminal and the drain terminal of the NMOS transistor 48 is decreased. Accordingly, the mirror current flowing between the source terminal and the drain terminal of the NMOS transistor 42 that is connected to the connection point ∝ in through the mirror connection is decreased. As a result, it is possible to increase the threshold value used in the NAND circuit 14A.

As described above, in the second embodiment, the variable resistor 44A is disposed in the current mirror circuit 38A for adjusting the reference current i1. Accordingly, it is possible to easily adjust the threshold value used in the NAND circuit 14A. It is noted that the threshold value may be adjusted, for example, in a proving process (the first testing step) after a wafer process step of a semiconductor device is completed.

Third Embodiment

A third embodiment of the present invention will be explained next. In the following description, a configuration of a clock control device 11B in the third embodiment that is different from that of the clock control device 11A in the second embodiment will be mainly explained.

Figure 7:
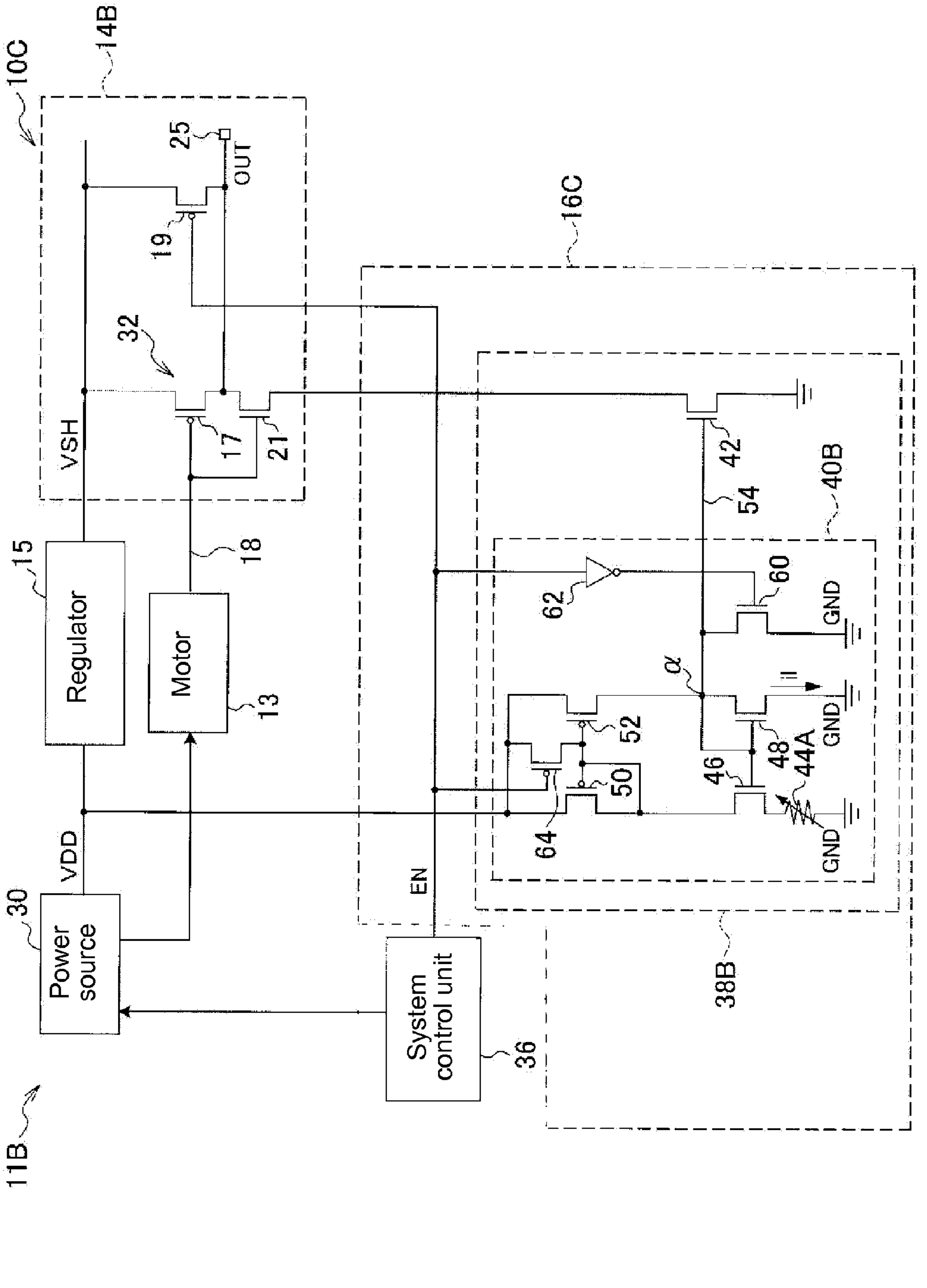
FIG. 7 is a block diagram showing a configuration of a clock control device according to a third embodiment of the present invention.
Figure 8:
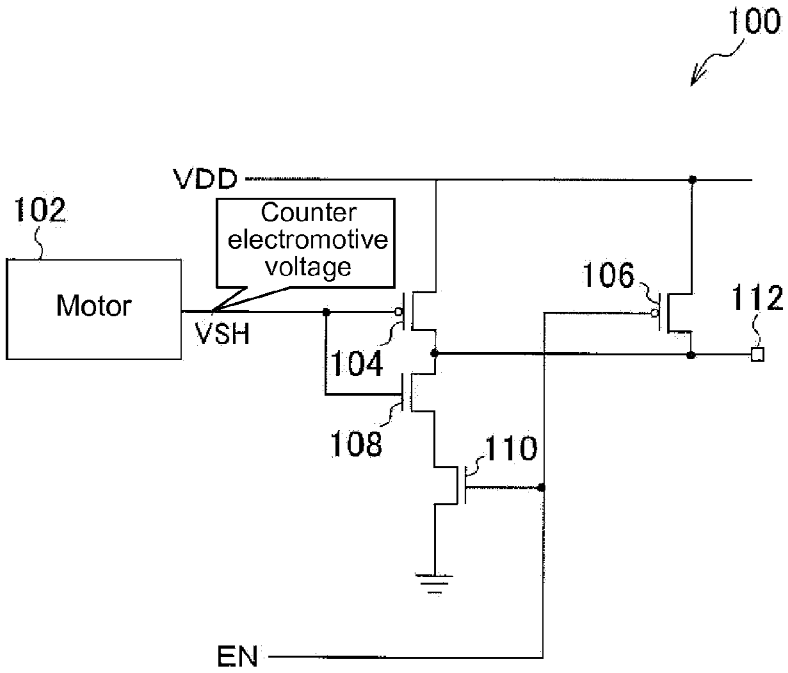
FIG. 8 PRIOR ART
FIG. 8 is a circuit diagram showing a configuration No. 1 of an NAND circuit of a conventional voltage determination device.
Figure 9:
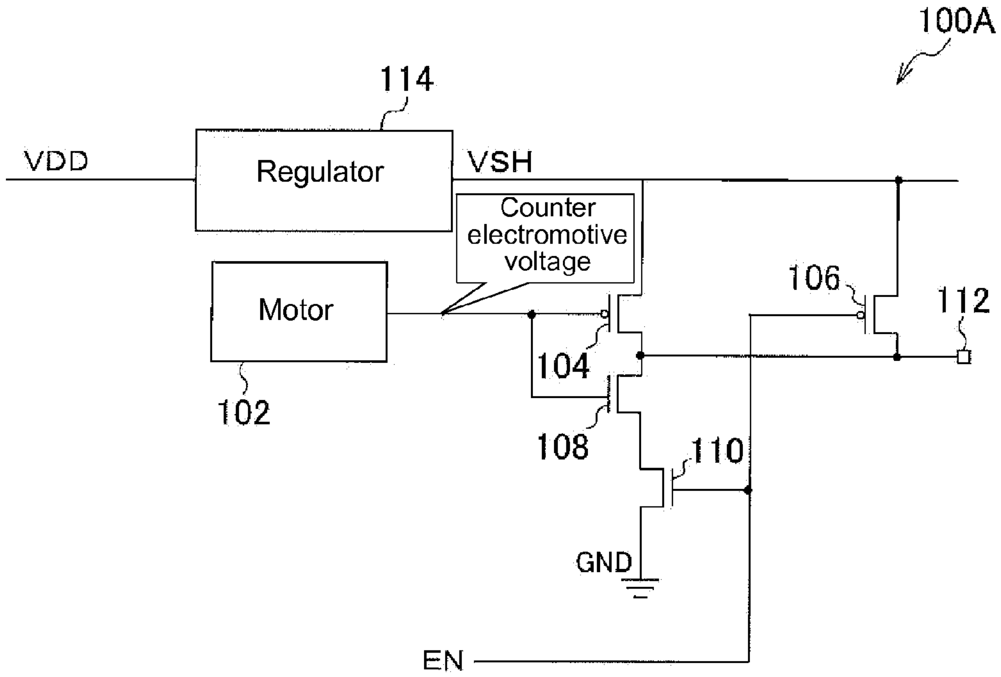
FIG. 9 PRIOR ART
FIG. 9 is a circuit diagram showing a configuration No. 2 of the NAND circuit of the conventional voltage determination device.

FIG. 7 is a block diagram showing the configuration of the clock control device 11B according to the THIRD embodiment of the present invention. As shown in FIG. 7, as opposed to the clock control device 11A in the second embodiment, the clock control device 11B includes a voltage determination device 10C instead of the voltage determination device 10B.

In the embodiment, as opposed to the voltage determination device 10B in the second embodiment, the voltage determination device 10C includes an NAND circuit 14B instead of the NAND circuit 14A, and includes a control unit 16C instead of the control unit 16B. As opposed to the NAND circuit 14A in the second embodiment, the NAND circuit 14B does not include the NMOS transistor 23. As opposed to the control unit 16B in the second embodiment, the control unit 16C includes a current mirror circuit 38B instead of the current mirror circuit 38A. Further, as opposed to the current mirror circuit 38A in the second embodiment, the current mirror circuit 38B includes a reference current generation circuit 40B instead of the reference current generation circuit 40A. Further, as opposed to the reference current generation circuit 40A in the second embodiment, the reference current generation circuit 40B further includes an NMOS transistor 60, an inversion logic unit 62, and a PMOS transistor 64. It is noted that, in the third embodiment, the NMOS transistor 60 and the PMOS transistor 64 functions as the first switching portion.

In the embodiment, a drain terminal of the NMOS transistor 60 is connected to the wiring portion 54, and a source terminal of the NMOS transistor 60 is connected to the ground line GND. A gate terminal of the inversion logic unit 62 is connected to an output terminal of the inversion logic unit 62. An input terminal of the inversion logic unit 62 is connected to an output terminal of the enable line EN. A gate terminal of the PMOS transistor 64 is connected to the enable line EN. Further, a source terminal of the PMOS transistor 64 is connected to the voltage line VDD, and a drain terminal of the PMOS transistor 64 is connected to the gate terminal of the PMOS transistor 50 and the gate terminal of the PMOS transistor 52.

In the voltage determination device 10C of the clock control device 11B with the configuration described above, when the voltage applied to the enable line EN is at the high level, the PMOS transistor 64 becomes the off state, and an output of the inversion logic unit 62 becomes the low level. As a result, the NMOS transistor 60 is switched from the on state to the off state, so that the reference current i1 flows between the source terminal and the drain terminal of the NMOS transistor 48. Further, the PMOS transistor 19 becomes the off state, so that the NAND circuit 14B is in the state capable of determining the level of the counter electromotive voltage.

On the other hand, when the voltage applied to the enable line EN is at the low level, the PMOS transistor 64 becomes the off state, and the output of the inversion logic unit 62 becomes the high level. As a result, the NMOS transistor 60 is switched from the off state to the on state, so that the reference current i1 does not flow between the source terminal and the drain terminal of the NMOS transistor 48. Further, the PMOS transistor 19 becomes the on state, so that the voltage of the output terminal 25 is maintained at the high level.

As described above, in the third embodiment, the reference current generation circuit 40B includes the NMOS transistor 60, the inversion logic unit 62, and the PMOS transistor 64 for blocking the reference current i1. Accordingly, it is possible to reduce the power consumption of the reference current generation circuit 40B when the clock control device 11B does not determine the level of the counter electromotive voltage.

In the first to third embodiments described above, the voltage determination device includes the CMOS circuit 32. Alternatively, the voltage determination device may include any switching circuit as far as the switching circuit is capable of performing a switching operation similar to that of the CMOS circuit 32. In this case, the through electric current flows through the switching circuit according to the transition of the level of the counter electromotive voltage.

More specifically, in the first to third embodiments described above, the switching circuit is formed of the combination of the PMOS transistor 17 and the NMOS transistor 21. Alternatively, the switching circuit may be formed of a combination of a pair of bipolar transistors having different conductive types.

Further, in the first to third embodiments described above, the NAND circuit 14A or the NAND circuit 14B is provided for determining the level of the counter electromotive voltage. Alternatively, other type of logic circuit such as an AND circuit, an OR circuit, and an NOR circuit may be applied to the present invention.

Further, in the first to third embodiments described above, the present invention is applied to the clock control device 11, the clock control device 11A or the clock control device 11B. Alternatively, the present invention may be applicable to a circuit, in which it is difficult to accurately determine the level of the determination target voltage because the threshold value tends to fluctuate due to the through electric current.

The disclosure of Japanese Patent Application No. 2010-285711, filed on Dec. 22, 2010, is incorporated in the application by reference.

While the invention has been explained with reference to the specific embodiments of the invention, the explanation is illustrative and the invention is limited only by the appended claims.

What is claimed is:

1. A voltage determination device, comprising:

a reference voltage generation circuit for generating a first reference voltage having a specific level;

a determination target voltage line to which a determination target voltage is applied;

a first voltage line to which the first reference voltage generated with the reference voltage generation circuit is applied;

a second voltage line to which a second reference voltage having a level different from the specific level of the first reference voltage is applied;

a switching circuit disposed between the first voltage line and the second voltage line for connecting the first voltage line and the second voltage line, said switching circuit being configured to perform a switching operation according to a level of the determination target voltage applied to the determination target voltage line;

a determining circuit for comparing the level of the determination target voltage applied to the determination target voltage line with a threshold value voltage to determine the level of the determination target voltage; and a control unit for controlling a resistivity between the switching circuit and the second voltage line and controlling a level of the electric current flowing between the first voltage line and the second voltage line so that the level of the electric current flowing between the first voltage line and the second voltage line is maintained at a specific level when the control unit controls the determining circuit to determine the level of the determination target voltage, including a timing when the determination target voltage is applied to the determination target voltage line.

2. The voltage determination device according to claim 1, wherein said control unit includes a reference current generation circuit for generating a reference current having a specific level and a current mirror circuit for flowing a mirror current corresponding to the reference current generated with the reference current generation circuit between the first voltage line and the second voltage line when the control unit controls the determining circuit to determine the level of the determination target voltage, including the timing when the determination target voltage is applied to the determination target voltage line.

3. The voltage determination device according to claim 2, wherein said reference voltage generation circuit is configured to generate the first reference voltage according to a power source voltage supplied from a specific power source, said reference current generation circuit being configured to receive the power source voltage supplied from the specific power source so that the reference current generation circuit generates the reference current according to the power source voltage thus supplied.

4. The voltage determination device according to claim 2, wherein said determining circuit includes an output terminal for outputting a signal indicating a determination result, said switching circuit including a first switching element and a second switching element, said first switching element having a first conductive type, said first switching element including a first terminal, a second terminal, and a first control terminal; and said second switching element having a second conductive type different from the first conductive type, said second switching element including a third terminal, a fourth terminal, and a second control terminal, said first terminal being connected to the first voltage line, said third terminal being connected to the second voltage line, said second terminal being connected to the fourth terminal and the output terminal, said first control terminal being connected to the second control terminal and the determination target voltage line, said current mirror circuit includes a third switching element having the second conductive type, said third switching element including a fifth terminal and a sixth terminal, said third switching element disposed between the first switching element and the second switching element so that the mirror current flows between the fifth terminal and the sixth terminal.

5. The voltage determination device according to claim 4, wherein said first switching element is formed of a P-channel type field effect transistor, said second switching element is formed of an N-channel type field effect transistor, and said third switching element is formed of an N-channel type field effect transistor.

6. The voltage determination device according to claim 2, wherein said current mirror circuit includes a variable resistor capable of adjusting the mirror current.

7. The voltage determination device according to claim 1, further comprising a supply unit for supplying a period signal switching between a determination period level indicating a determination period during which the control unit controls the determining circuit to determine the level of the determination target voltage, including the timing when the determination target voltage is applied to the determination target voltage line, and a non-determination period level indicating a non-determination period except the determination period, said determining circuit being configured to determine the level of the determination target voltage during the determination period, said determining circuit being configured to not determine the level of the determination target voltage during the non-determination period.

8. The voltage determination device according to claim 7, wherein said determining circuit includes a first switching portion and a second switching portion, said first switching portion being configured to switch between a conduction state in which the switching circuit is capable of being conducted with the second voltage line when the period signal supplied from the supply unit has the determination period level, and a non-conduction state in which the switching circuit is not conducted with the second voltage line when the period signal supplied from the supply unit has the non-determination period level, said second switching portion being configured to switch between an output permitted state in which the determining circuit is controlled to output a determination result thereof when the period signal supplied from the supply unit has the determination period level, and an output prohibited state in which the determining circuit is controlled to not output the determination result when the period signal supplied from the supply unit has the non-determination period level.

9. The voltage determination device according to claim 8, wherein said determining circuit further includes a third voltage line to which the determining circuit applies a voltage indicating the determination result, said first switching portion being formed of an N-channel type field effect transistor having a gate terminal connected to the supply unit so that the supply unit supplies the period signal to the gate terminal, said N-channel type field effect transistor being disposed between the switching circuit and the second voltage line so that a source terminal thereof is conducted with a drain terminal thereof to make the switching circuit capable of being conducted with the second voltage line when the period signal having the determination period level is supplied to the gate terminal, and the source terminal thereof is not conducted with the drain terminal thereof to make the switching circuit capable of being not conducted with the second voltage line when the period signal having the non-determination period level is supplied to the gate terminal, said second switching portion being formed of a P-channel type field effect transistor having a gate terminal connected to the supply unit so that the supply unit supplies the period signal to the gate terminal, said P-channel type field effect transistor being disposed between the first voltage line and the third voltage line so that a source terminal thereof is not conducted with a drain terminal thereof to make the first voltage line not conducted with the third voltage line when the period signal having the determination period level is supplied to the gate terminal, and the source terminal thereof is conducted with the drain terminal thereof to make the first voltage line conducted with the third voltage line when the period signal having the non-determination period level is supplied to the gate terminal.

10. The voltage determination device according to claim 3, further comprising a supply unit for supplying a period signal switching between a determination period level indicating a determination period during which the control unit controls the determining circuit to determine the level of the determination target voltage, including the timing when the determination target voltage is applied to the determination target voltage line, and a non-determination period level indicating a non-determination period except the determination period, said determining circuit including a first switching portion and a second switching portion, said first switching portion being configured to switch between a conduction state in which the power source is conducted with the reference current generation circuit so that the reference current generation circuit generates the reference current when the period signal has the determination period level, and a non-conduction state in which the power source is not conducted with the reference current generation circuit so that the reference current generation circuit does not generate the reference current when the period signal has the non-determination period level, said second switching portion being configured to switch between an output permitted state in which the determining circuit is controlled to output a determination result thereof when the period signal supplied from the supply unit has the determination period level, and an output prohibited state in which the determining circuit is controlled to not output the determination result when the period signal supplied from the supply unit has the non-determination period level.

11. The voltage determination device according to claim 10, further comprising a constant voltage line disposed over the reference current generation circuit and the current mirror circuit so that a constant voltage is applied to the constant voltage line according to the reference current generated with the reference current generation circuit to flow the mirror current between the first voltage line and the second voltage line, said determining circuit further including a third voltage line to which the determining circuit applies a voltage indicating the determination result, said first switching portion being formed of a P-channel type field effect transistor and an N-channel type field effect transistor, said P-channel type field effect transistor having a gate terminal connected to the supply unit so that the supply unit supplies the period signal to the gate terminal, said P-channel type field effect transistor being disposed between the power source and the reference current generation circuit so that a source terminal thereof is not conducted with a drain terminal thereof to make the power source capable of supplying the power source voltage to the reference current generation circuit when the period signal having the determination period level is supplied to the gate terminal, and the source terminal thereof is conducted with the drain terminal thereof to make the power source capable of supplying the power source voltage to the reference current generation circuit when the period signal having the non-determination period level is supplied to the gate terminal, said N-channel type field effect transistor having a gate terminal connected to the supply unit through an inversion logic unit so that the supply unit supplies the period signal to the gate terminal, said first switching portion being disposed between the constant voltage line and the second voltage line so that a source terminal thereof is not conducted with a drain terminal thereof to flow the mirror current between the first voltage line and the second voltage line when an inversion signal of the period signal having the determination period level is supplied to the gate terminal, and the source terminal thereof is conducted with the drain terminal thereof to not flow the mirror current between the first voltage line and the second voltage line when the inversion signal of the period signal having the non-determination period level is supplied to the gate terminal, said second switching portion being formed of a P-channel type field effect transistor having a gate terminal connected to the supply unit so that the supply unit supplies the period signal to the gate terminal, said P-channel type field effect transistor being disposed between the first voltage line and the third voltage line so that a source terminal thereof is not conducted with a drain terminal thereof to make the first voltage line not conducted with the third voltage line when the period signal having the determination period level is supplied to the gate terminal, and the source terminal thereof is conducted with the drain terminal thereof to make the first voltage line conducted with the third voltage line when the period signal having the non-determination period level is supplied to the gate terminal.

12. A clock control device comprising the voltage determination device according to claim 1, wherein said determination target voltage line being configured so that a counter electromotive voltage generated in a motor of a clock as the determination target voltage is applied to the determination target voltage line when a drive current supplied to the motor to move a clock hand is shut down.

13. The clock control device according to claim 11, wherein said control unit is configured to be capable of controlling the determining circuit so that the determining circuit starts determining the level of the determination target voltage when the counter electromotive voltage is generated in the motor.

* * * * *